United States Patent
Pham et al.

(10) Patent No.: US 8,957,510 B2
(45) Date of Patent: Feb. 17, 2015

(54) USING AN INTEGRATED CIRCUIT DIE CONFIGURATION FOR PACKAGE HEIGHT REDUCTION

(71) Applicants: Tim V. Pham, Austin, TX (US); James R. Guajardo, Georgetown, TX (US); Michael B. McShane, Austin, TX (US)

(72) Inventors: Tim V. Pham, Austin, TX (US); James R. Guajardo, Georgetown, TX (US); Michael B. McShane, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/935,015

(22) Filed: Jul. 3, 2013

(65) Prior Publication Data

US 2015/0008567 A1 Jan. 8, 2015

(51) Int. Cl.
*H01L 23/495* (2006.01)
*H01L 23/31* (2006.01)
*H01L 23/00* (2006.01)

(52) U.S. Cl.
CPC ........ *H01L 23/4951* (2013.01); *H01L 23/3114* (2013.01); *H01L 24/97* (2013.01)
USPC ........... 257/676; 257/611; 257/666; 438/123; 438/125

(58) Field of Classification Search
USPC .......... 257/611, 614, 666, 673, 676; 438/123, 438/125
See application file for complete search history.

(56) References Cited

U.S. PATENT DOCUMENTS

| | | | |
|---|---|---|---|
| 5,195,023 A | 3/1993 | Manzione et al. | |
| 5,455,200 A | 10/1995 | Bigler et al. | |
| 5,696,666 A | 12/1997 | Miles et al. | |
| 6,201,186 B1 | 3/2001 | Daniels et al. | |
| 6,664,649 B2 | 12/2003 | Huang | |
| 7,713,781 B2 | 5/2010 | Wang et al. | |
| 2006/0220241 A1* | 10/2006 | Thornton et al. | 257/734 |
| 2008/0211090 A1* | 9/2008 | Weekamp et al. | 257/734 |
| 2008/0237887 A1 | 10/2008 | Takiar et al. | |
| 2009/0026592 A1* | 1/2009 | Kwang et al. | 257/676 |
| 2009/0045491 A1* | 2/2009 | Kim | 257/673 |
| 2010/0327421 A1 | 12/2010 | Luan | |
| 2011/0057296 A1* | 3/2011 | Feng et al. | 257/618 |

OTHER PUBLICATIONS

Lassig, S., "Manufacturing integration considerations of through-silicon via etching", Solid State Technology, Insights for Electronics Manufacturing, Dec. 1, 2007.

* cited by examiner

*Primary Examiner* — Phuc Dang

(57) ABSTRACT

A semiconductor device includes a semiconductor die having a first major surface and a second major surface opposite the first major surface, a first minor surface and a second minor surface opposite the first minor surface, a plurality of contact pads on the first major surface, and a notch which extends from the first minor surface and the second major surface into the semiconductor die. The notch has a notch depth measured from the second major surface into the semiconductor die, wherein the notch depth is less than a thickness of the semiconductor die, and a notch length measured from the first minor surface into the semiconductor die, wherein the notch length is less than a length of the semiconductor die measured between the first and second minor surfaces. The device includes a lead having a first end in the notch, and an encapsulant over the first major surface.

20 Claims, 4 Drawing Sheets

USING AN INTEGRATED CIRCUIT DIE CONFIGURATION FOR PACKAGE HEIGHT REDUCTION

BACKGROUND

1. Field

This disclosure relates generally to packaging integrated circuits, and more specifically, to die configurations of the integrated circuits that are useful in packaging.

2. Related Art

In the field of semiconductors, a continuing goal is to reduce dimensions and this includes the dimensions of the final package. The total area is important but also the height of the packaged device. The height can be reduced by thinning the various elements that determine device height such as the thickness of the die, the thickness of the supporting package, the height of wire bonds, and the thickness of the encapsulant. Each of these elements must maintain their intended function reliably which can be difficult. Die thickness relates to sufficient strength to be moved in wafer form. The encapsulant must provide sufficient protection for the die. The height of the wire bonds must be sufficient to be reliable and avoid shorting. The supporting package must be robust enough to provide for handling in transportation and assembly in a final product in a manufacturing environment.

Another continuing issue is heat dissipation. One difficulty with heat dissipation is the ability to directly access the die, which is the source of the heat. Packages that allow this, such as lead-on-chip, raise more difficult manufacturing issues than the more conventional approach of bonding a die to a metal flag.

Accordingly there is a need to provide reduced final package size while addressing the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device includes a semiconductor die having a bottom edge with a notch that allows a lead of a lead frame to fit in the notch. This reduces the increase in height that occurs when a lead frame is placed under the semiconductor device. This is better understood by reference to the drawings and the following description.

Figure 1:
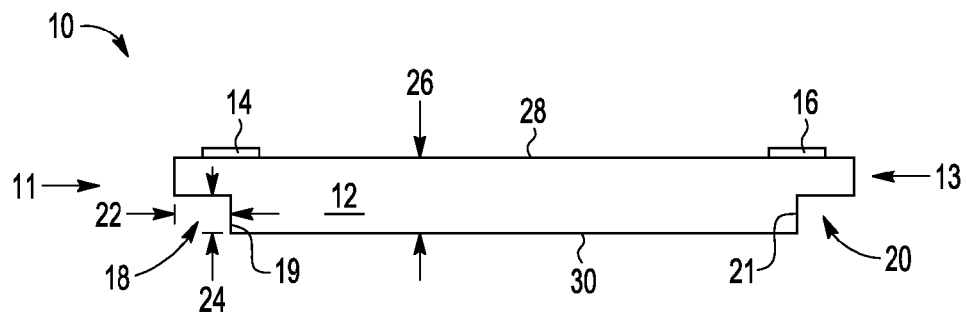
FIG. 1 is a cross section of a semiconductor device at a stage in processing according to an embodiment.

Shown in FIG. 1 is a semiconductor device 10 having a semiconductor die 12 having an active side 28 and a backside 30, which are the major surfaces 28 and 30 of semiconductor die 12. Die 12 may include a plurality of substrate layers. Active side 28 is also the top side in this example. Semiconductor die 12 has contact pads 14 and 16 on active side 28, a notch 18 along a first edge 11 of backside 30, and a notch 20 along a second edge 13 of backside 30. The first and second edges 11 and 13 may be considered minor surfaces 11 and 13 of semiconductor die 12. Notch 18 may be one a plurality of notches along the first edge in one configuration and may extend the length of the first edge in a second configuration. Notch 18 has an endwall 19 which is the extent that notch 18 extends from first outer edge 11 of semiconductor die 12. This is shown as length 22. Depth of notch 18 is measured from backside 30 and is shown as depth 24. Notch 20 has an endwall 21. Notch 20 may have the same length and depth as notch 18. Semiconductor die 12 has a thickness 26. Depth 24 must be sufficiently less than thickness 26 to avoid excessive risk of damage to semiconductor die 12 in the various processes required to achieve a finished package die.

Figure 2:
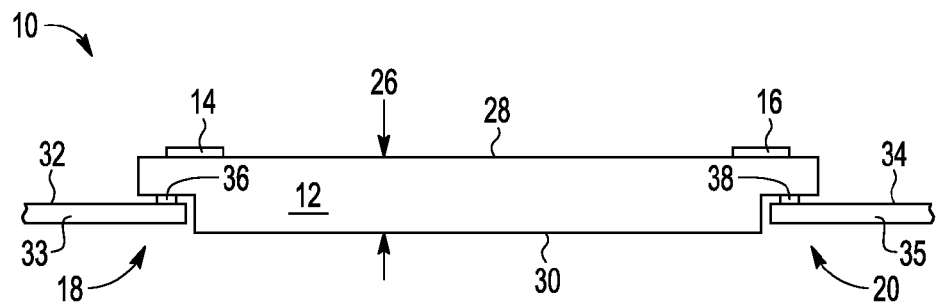
FIG. 2 is a cross section of the semiconductor device of FIG. 1 at a subsequent stage in processing.
Figure 8:
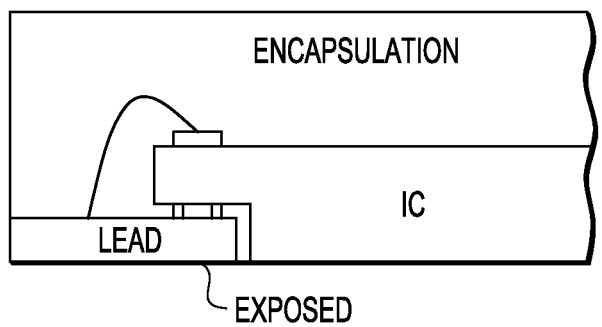
FIG. 8 is a cross section of a portion of an alternative semiconductor device to the semiconductor device as shown in FIG. 3.

Shown in FIG. 2 is semiconductor device 10 after semiconductor die 12 is placed on a lead frame having a plurality of leads such as leads 32 and 34. This has the effect of an end portion of lead 32 being in notch 18, an end portion of a lead 34 being in notch 20, a top surface of the end portion of lead 32 being attached to a top surface of notch 18 with an adhesive 36, and a top surface of the end portion of lead 34 being attached to a top surface of notch 20 with an adhesive 38. Adhesives 36 and 38 hold leads 32 and 34 in place during assembly in preparation for encapsulation. A bottom surface 33 of lead 32 and a bottom surface 35 of lead 34 may preferably be above the surface of backside 30. This provides for the opportunity for the encapsulant to encapsulate leads 32 and 34. In this case, the thickness of leads 32 and 34 is less than depth 24 by enough to accommodate adhesives 36 and 38 and still be recessed to avoid coplanarity with the surface of backside 30. For example, a thickness of the lead, measured in a same direction as the notch depth, may be at least 80% of the notch depth. The notch length may be at least 25 micrometers. Adhesives currently in use for attaching semiconductor die to lead frames may be used as adhesives 36 and 38. As an alternative, adhesives 36 and 38 may not be required at this stage. Some benefit can still be obtained if leads 32 and 34 have some portion below the surface of backside 30. On the other hand, it may be desirable to have bottom surfaces 33 and 35 of leads 32 and 34 be coplanar with the surface of backside 30 and exposed which is the approach in a package type known as QFN and shown in FIG. 8. Also leads 32 and 34 are shown as being uniform in thickness but they may vary. For example, they may be thinned where they enter notches 18 and 20.

Figure 3:
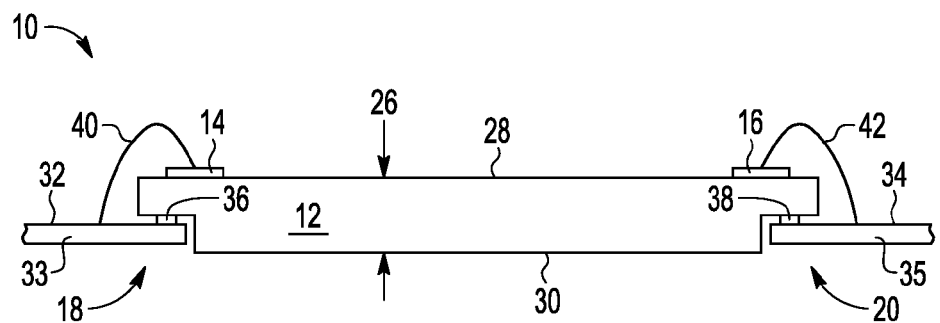
FIG. 3 is a cross section of the semiconductor device of FIG. 2 at a subsequent stage in processing.

Shown in FIG. 3 is semiconductor device 10 after a wirebond 40 is connected on one end to lead 32 and on another end to contact pad 14 and a wirebond 42 is connected on one end to lead 34 and on another end to contact pad 16. Leads 32 and 34 are thicker than contact pads 14 and 16 but thinner than the length of endwalls 19 and 21 so that leads 32 and 34 do not extend below bottom surface 30.

Figure 4:
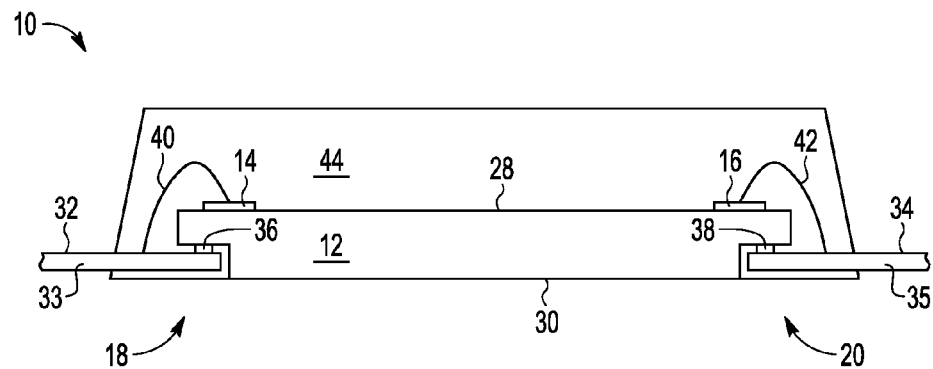
FIG. 4 is a cross section of the semiconductor device of FIG. 3 at a subsequent stage in processing.

Shown in FIG. 4 is semiconductor device 10 after encapsulating semiconductor die 12, wirebonds 40 and 42, and portions of leads 32 and 34 including portions of bottom surfaces 33 and 35 as well as filling in notches 18 and 20 with an encapsulant 44. The bottom surface of encapsulant 44 is coplanar with the surface of backside 30. Semiconductor device 10 of FIG. 4 shows a completed packaged die. Bottom surface 30 is exposed which is excellent for attaching heat dissipating structures to semiconductor die 12. As shown, leads 32 and 34 do not contribute to the total height of semiconductor device 10. The total height is just from surface of backside 30 to the top surface of encapsulant 44. Even if leads 32 and 34 extend only partially below bottom surface 30, there is still a benefit of a reduction in height of an amount equal to the extent to which leads 32 and 34 extend into notches 18 and 20. Alternatively, it may be desirable to encapsulate bottom surfaces 33 and 35 as well as the die backside 30.

Figure 5:
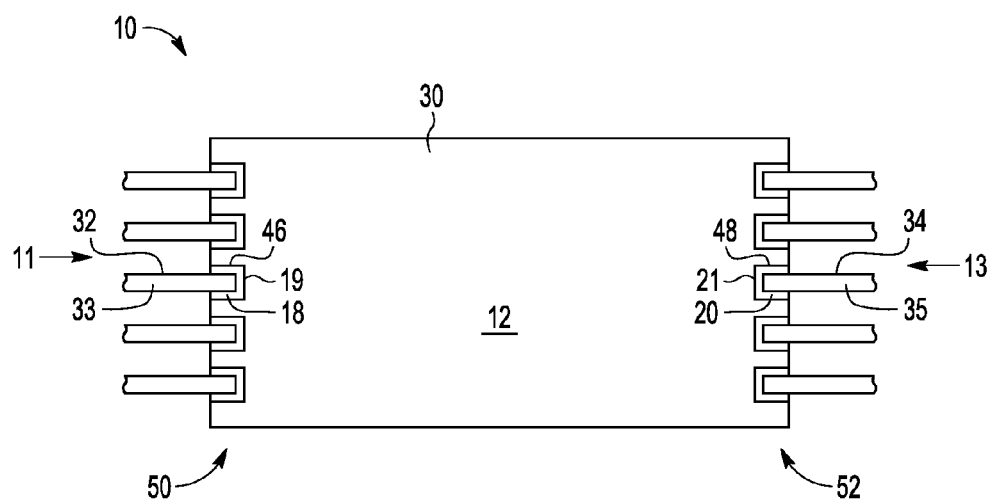
FIG. 5 is bottom view of the semiconductor device of FIG. 4 in a first configuration.

Shown in FIG. 5 is semiconductor device 10 of FIG. 3, in a first configuration, viewed toward backside 30. In this first configuration, there are plurality 50 of notches along minor surface 11, including notch 18, and a plurality 52 of notches along minor surface 13, including notch 20. In this first configuration, each lead has its own notch and each notch has sidewalls. For example, notch 18 has a sidewall 46, and notch 20 has a sidewall 48. This shows a plurality of notches on opposing minor surfaces. The other two minor surfaces could also have pluralities of notches with leads. Also this shows one lead per notch, but the notches could be extended to receive more than one lead. For example, there could be two leads per notch.

Figure 6:
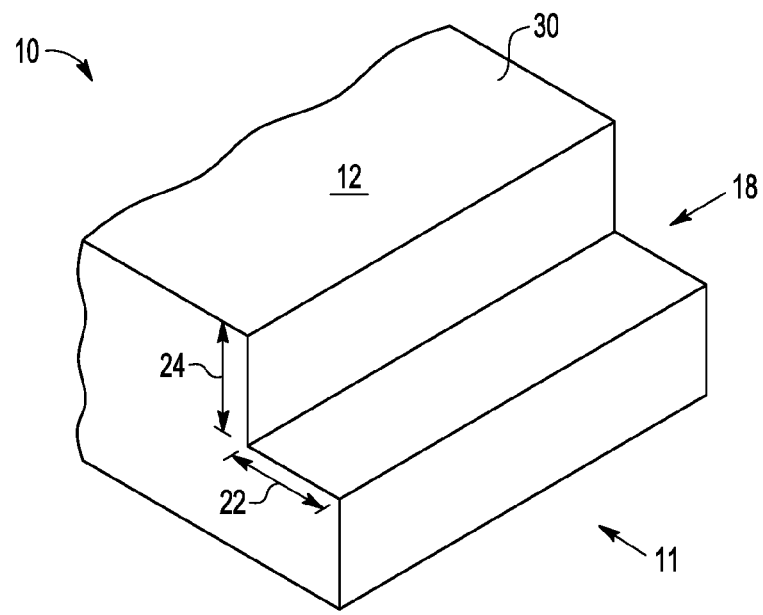
FIG. 6; is an isometric view of the semiconductor device of FIG. 1 in a second configuration.

Shown in FIG. 6, in isometric form, is a portion of semiconductor device 10 of FIG. 1, in a second configuration viewed with edge 11 in front and backside 30 on top. This shows that notch 18 extends for the length of edge 11. All of the leads, for a given edge, in this second configuration would in the same notch. The spacing of the leads would be achieved by proper placement of the leads and held by adhesives such as adhesives 36 and 38. Depth 24 and length 22 are shown which define the length and depth of notch 18. Notch 20 would be on the opposing edge which is edge 13. The other two minor surfaces could also have notches, like notch 18 shown in FIG. 6, that span the length of the minor surfaces.

Figure 7:
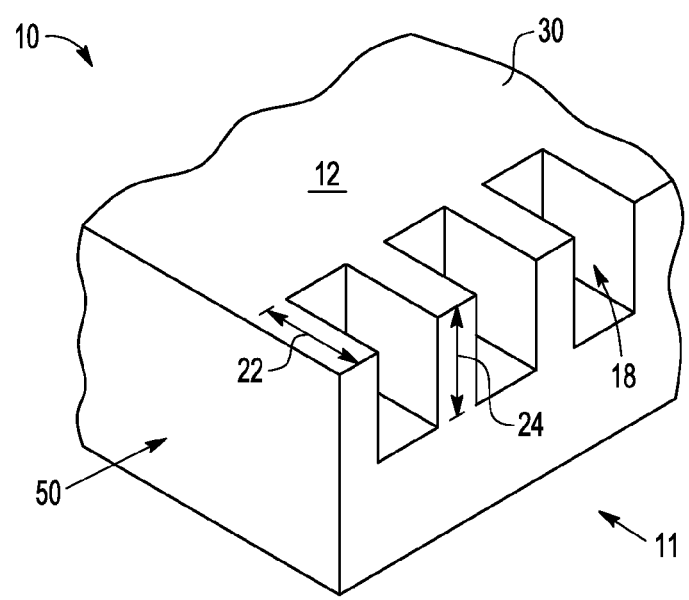
FIG. 7 is an isometric view of a portion of the semiconductor device of FIG. 1 of in the first configuration.

Shown in FIG. 7, in isometric form, is a portion of semiconductor device 10 of FIG. 1, in the first configuration viewed from edge 11 and backside 30. This shows three notches of plurality of notches 50 including notch 18. Shown also are length 22 and depth 24. Plurality of notches, similar to notches 50, could be on the other minor surfaces.

As a manner of making notch 18 as shown in FIG. 6, this can be achieved by first etching a channel between semiconductor die on a wafer that has a depth of depth 24 and a length across the channel sufficient to result in length 22 after singulation.

As a manner of making a notch such as notch 18 of FIGS. 5 and 7, this can be performed as a patterned etch performed as part of the wafer fabrication process that will result in the desired length 22 and depth 24 after singulation. Other techniques include using a grinder or a laser to achieve the desired length 22 and depth 24 after singulation.

By now it should be appreciated that there has been provided a semiconductor device having a semiconductor die having a first major surface and a second major surface opposite the first major surface, a first minor surface and a second minor surface opposite the first minor surface, wherein the first and second minor surfaces are between the first and second major surfaces, a plurality of contact pads on the first major surface, and a notch which extends from the first minor surface and the second major surface into the semiconductor die. The semiconductor die has a further characterization by which the notch has a notch depth measured from the second major surface into the semiconductor die, wherein the notch depth is less than a thickness of the semiconductor die, and a notch length measured from the first minor surface into the semiconductor die, wherein the notch length is less than a length of the semiconductor die measured between the first and second minor surfaces . . . . The semiconductor device further includes a lead having a first end in the notch. The semiconductor device further includes an encapsulant over the first major surface of the semiconductor die. The semiconductor device may have a further characterization by which the encapsulant extends into the notch. The semiconductor device may further include a wire bond connected between a contact pad of the plurality of contact pads and the lead, wherein the encapsulant is over the wire bond. The semiconductor device may further include an adhesive in the notch between the lead and the semiconductor die. The semiconductor device may have a further characterization by which the semiconductor die has a third minor surface and a fourth minor surface opposite the third minor surface, wherein the third and four minor surfaces are substantially perpendicular to the first and second minor surfaces, and wherein the notch extends through the semiconductor die from the third minor surface to the fourth minor surface. The semiconductor device may have a further characterization by which the notch is one of a plurality of notches, wherein each of the plurality of notches extends from the first minor surface and the second major surface into the semiconductor die, and wherein each notch of the plurality of notches has a notch depth less than the thickness of the semiconductor die and a notch length less than the length of the semiconductor die. The semiconductor device may have a further characterization by which the lead is one of a plurality of leads, and wherein each of the plurality of notches includes a first end of one or more leads of the plurality of leads. The semiconductor device may have a further characterization by which each notch of the plurality of notches has a same notch length and a same notch depth. The semiconductor device may have a further characterization by which a thickness of the lead, measured in a same direction as the notch depth, is at least 80% of the notch depth. The semiconductor device may have a further characterization by which the notch length is at least 25 micrometers. The semiconductor device may have a further characterization by which at least a portion of the second major surface is exposed. The semiconductor device may have a further characterization by which the semiconductor die comprises a plurality of substrate layers.

Also disclosed is a method for forming a semiconductor device that includes forming a notch in a semiconductor die having a first major surface, a second major surface opposite the first major surface, a first minor surface, a second minor surface opposite the first minor surface, and a plurality of contact pads on the first major surface. The notch extends from the first minor surface and the second major surface into the semiconductor die. The notch further has a notch depth measured from the second major surface into the semiconductor die, wherein the notch depth is less than a thickness of the semiconductor die, and a notch length measured from the first minor surface into the semiconductor die, wherein the notch length is less than a length of the semiconductor die measured between the first and second minor surfaces. The method further includes placing a first end of a lead into the notch. The method further includes forming an encapsulant over the first major surface of the semiconductor die. The method has a further characterization by which forming the encapsulant is performed such that the encapsulant extends into the notch. The method further includes forming a wire bond connection between a contact pad of the plurality of contact pads and the lead, wherein the encapsulant is over the wire bond connection. The method has a further characterization by which the placing the first end of the lead into the notch comprises attaching the first end to the semiconductor die with an adhesive. The method has a further characterization by which wherein the semiconductor die has a third minor surface and a fourth minor surface opposite the third minor surface, wherein the third and four minor surfaces are substantially perpendicular to the first and second minor surfaces, and wherein forming the notch extends through the semiconductor die from the third minor surface to the fourth minor surface. The method has a further characterization by which forming the notch comprises forming a plurality of notches, wherein each of the plurality of notches extends from the first minor surface and the second major surface into the semiconductor die, and wherein each notch of the plurality of notches has a notch depth less than the thickness of the semiconductor die and a notch length less than the length of the semiconductor die. The method has a further characterization by which placing the lead comprises placing a first end of one or more leads of a plurality of leads into each notch of the plurality of notches.

Disclosed also is a semiconductor device having a semiconductor die having a first major surface and a second major surface, opposite the first major surface, a first minor surface and a second minor surface, opposite the first minor surface, a third minor surface and a fourth minor surface, opposite the third minor surface, wherein the first, second, third, and fourth minor surfaces are between the first and second major surfaces, a plurality of contact pads on the first major surface, and a notch which extends from the first minor surface and the second major surface into the semiconductor die and which extends through the semiconductor die from the third minor surface to the fourth minor surface. The semiconductor has a further characterization by which the notch has a notch depth measured from the second major surface into the semiconductor die, wherein the notch depth is less than a thickness of the semiconductor die. The semiconductor device further includes a plurality of leads, each having a first end in the notch. The semiconductor device further includes a plurality of wire bonds, each connected between a contact pad of the plurality of contact pads and a corresponding lead of the plurality of leads. The semiconductor device further includes an encapsulant over the plurality of wire bonds and over the first major surface of the semiconductor die.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the shapes of the notches can vary from that shown. For example, they may be rounded or a shape such as keyhole shape. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
    a semiconductor die having a first major surface and a second major surface opposite the first major surface, a first minor surface and a second minor surface opposite the first minor surface, wherein the first and second minor surfaces are between the first and second major surfaces, a plurality of contact pads on the first major surface, and a notch which extends from the first minor surface and the second major surface into the semiconductor die, wherein:
        the notch has a notch depth measured from the second major surface into the semiconductor die, wherein the notch depth is less than a thickness of the semiconductor die, and a notch length measured from the first minor surface into the semiconductor die, wherein the notch length is less than a length of the semiconductor die measured between the first and second minor surfaces;
    a lead having a first end in the notch; and
    an encapsulant over the first major surface of the semiconductor die.

2. The semiconductor device of claim 1, wherein the encapsulant extends into the notch.

3. The semiconductor device of claim 1, further comprising a wire bond connected between a contact pad of the plurality of contact pads and the lead, wherein the encapsulant is over the wire bond.

4. The semiconductor device of claim 1, further comprising an adhesive in the notch between the lead and the semiconductor die.

5. The semiconductor device of claim 1, wherein the semiconductor die has a third minor surface and a fourth minor surface opposite the third minor surface, wherein the third and four minor surfaces are substantially perpendicular to the first and second minor surfaces, and wherein the notch extends through the semiconductor die from the third minor surface to the fourth minor surface.

6. The semiconductor device of claim 1, wherein the notch is one of a plurality of notches, wherein each of the plurality of notches extends from the first minor surface and the second major surface into the semiconductor die, and wherein each notch of the plurality of notches has a notch depth less than the thickness of the semiconductor die and a notch length less than the length of the semiconductor die.

7. The semiconductor device of claim 6, wherein each notch of the plurality of notches has a same notch length and a same notch depth.

8. The semiconductor device of claim 6, wherein the lead is one of a plurality of leads, and wherein each of the plurality of notches includes a first end of one or more leads of the plurality of leads.

9. The semiconductor device of claim 1, wherein a thickness of the lead, measured in a same direction as the notch depth, is at least 80% of the notch depth.

10. The semiconductor device of claim 1, wherein the notch length is at least 25 micrometers.

11. The semiconductor device of claim 1, wherein at least a portion of the second major surface is exposed.

12. The semiconductor device of claim 1, wherein the semiconductor die comprises a plurality of substrate layers.

13. A method for forming a semiconductor device, comprising:
   forming a notch in a semiconductor die having a first major surface, a second major surface opposite the first major surface, a first minor surface, a second minor surface opposite the first minor surface, and a plurality of contact pads on the first major surface, wherein:
      the notch extends from the first minor surface and the second major surface into the semiconductor die, and
      the notch has a notch depth measured from the second major surface into the semiconductor die, wherein the notch depth is less than a thickness of the semiconductor die, and a notch length measured from the first minor surface into the semiconductor die, wherein the notch length is less than a length of the semiconductor die measured between the first and second minor surfaces;
   placing a first end of a lead into the notch; and
   forming an encapsulant over the first major surface of the semiconductor die.

14. The method of claim 13, wherein forming the encapsulant is performed such that the encapsulant extends into the notch.

15. The method of claim 13, further comprising forming a wire bond connection between a contact pad of the plurality of contact pads and the lead, wherein the encapsulant is over the wire bond connection.

16. The method of claim 13, wherein the placing the first end of the lead into the notch comprises attaching the first end to the semiconductor die with an adhesive.

17. The method of claim 13, wherein the semiconductor die has a third minor surface and a fourth minor surface opposite the third minor surface, wherein the third and four minor surfaces are substantially perpendicular to the first and second minor surfaces, and wherein forming the notch extends through the semiconductor die from the third minor surface to the fourth minor surface.

18. The method of claim 13, wherein forming the notch comprises forming a plurality of notches, wherein each of the plurality of notches extends from the first minor surface and the second major surface into the semiconductor die, and wherein each notch of the plurality of notches has a notch depth less than the thickness of the semiconductor die and a notch length less than the length of the semiconductor die.

19. The method of claim 18, wherein placing the lead comprises placing a first end of one or more leads of a plurality of leads into each notch of the plurality of notches.

20. A semiconductor device comprising:
   a semiconductor die having a first major surface and a second major surface, opposite the first major surface, a first minor surface and a second minor surface, opposite the first minor surface, a third minor surface and a fourth minor surface, opposite the third minor surface, wherein the first, second, third, and fourth minor surfaces are between the first and second major surfaces, a plurality of contact pads on the first major surface, and a notch which extends from the first minor surface and the second major surface into the semiconductor die and which extends through the semiconductor die from the third minor surface to the fourth minor surface, wherein:
      the notch has a notch depth measured from the second major surface into the semiconductor die, wherein the notch depth is less than a thickness of the semiconductor die;
   a plurality of leads, each having a first end in the notch;
   a plurality of wire bonds, each connected between a contact pad of the plurality of contact pads and a corresponding lead of the plurality of leads; and
   an encapsulant over the plurality of wire bonds and over the first major surface of the semiconductor die.

\* \* \* \* \*